United States Patent [19]

Sander

[11] Patent Number: 4,764,800
[45] Date of Patent: Aug. 16, 1988

[54] SEAL STRUCTURE FOR AN INTEGRATED CIRCUIT

[75] Inventor: Craig S. Sander, Cupertino, Calif.

[73] Assignee: Advanced Micro Devices, Inc., Sunnyvale, Calif.

[21] Appl. No.: 860,597

[22] Filed: May 7, 1986

[51] Int. Cl.$^4$ .................. H01L 27/04; H01L 23/48
[52] U.S. Cl. ........................... 357/51; 357/48; 357/50; 357/52; 357/53; 357/65
[58] Field of Search .............. 357/51, 48, 65, 52, 357/53, 50

[56] References Cited

U.S. PATENT DOCUMENTS

| | | | |
|---|---|---|---|
| 3,443,176 | 5/1969 | Agusta et al. | 357/51 |
| 3,659,162 | 4/1972 | Toshio et al. | 357/51 |
| 4,035,823 | 7/1977 | Marshall | 357/26 |
| 4,365,264 | 12/1982 | Mukai et al. | 357/52 |
| 4,583,109 | 4/1986 | Goetz | 357/52 |
| 4,656,055 | 4/1987 | Dwyer | 357/53 |

FOREIGN PATENT DOCUMENTS 60-98664  1/1985  Japan .................. 357/52

Primary Examiner—Andrew J. James
Assistant Examiner—Jerome Jackson, Jr.
Attorney, Agent, or Firm—Valet Eugene H.; Patrick T. King

[57] ABSTRACT

A seal structure for a semiconductor integrated circuit is disclosed. Contacts within and outside the region encircled by the seal structure are coupled by running a doped semiconductor region under the encircling seal. A reverse biased junction is formed at the interface of the seal and underlying doped semiconductor region. The best mode disclosed is related to sealing fuse components from the remainder of the circuit components while providing electrical coupling ability.

13 Claims, 5 Drawing Sheets

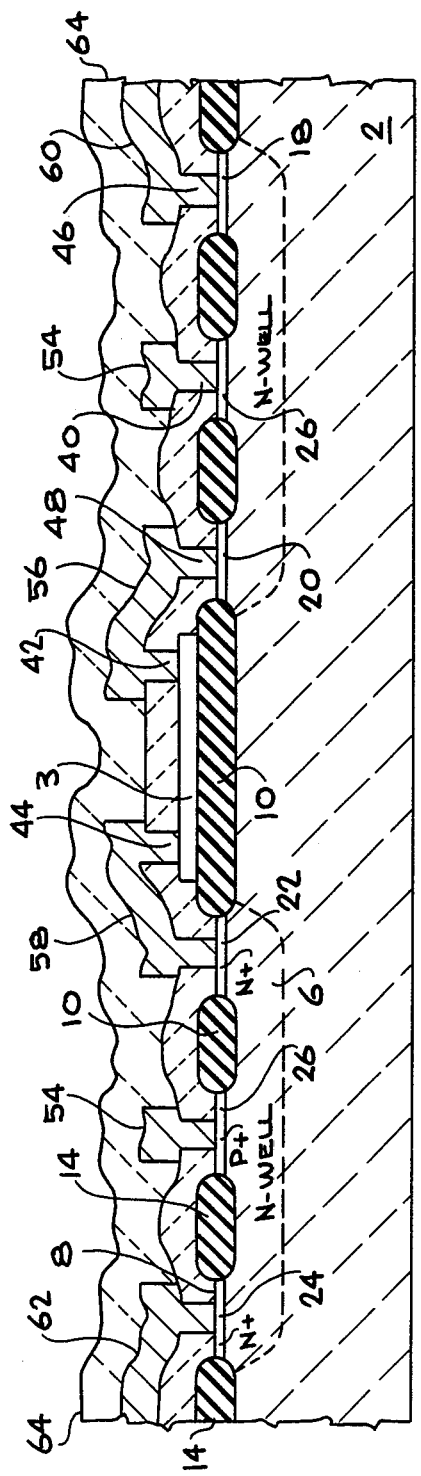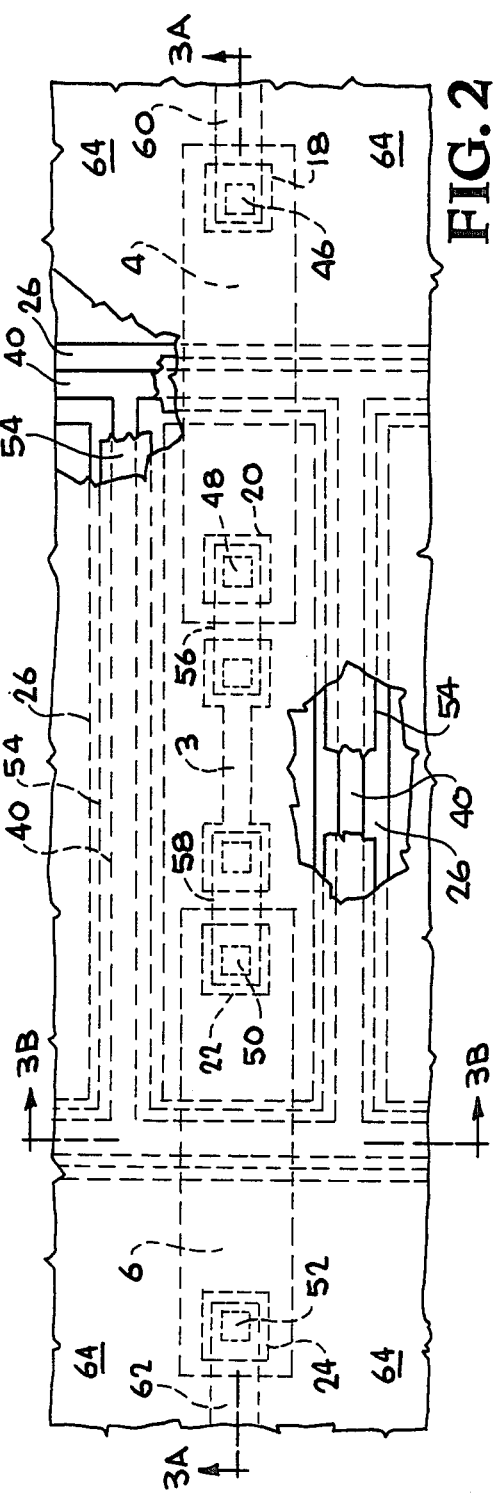
FIG. 3A
FIG. 2

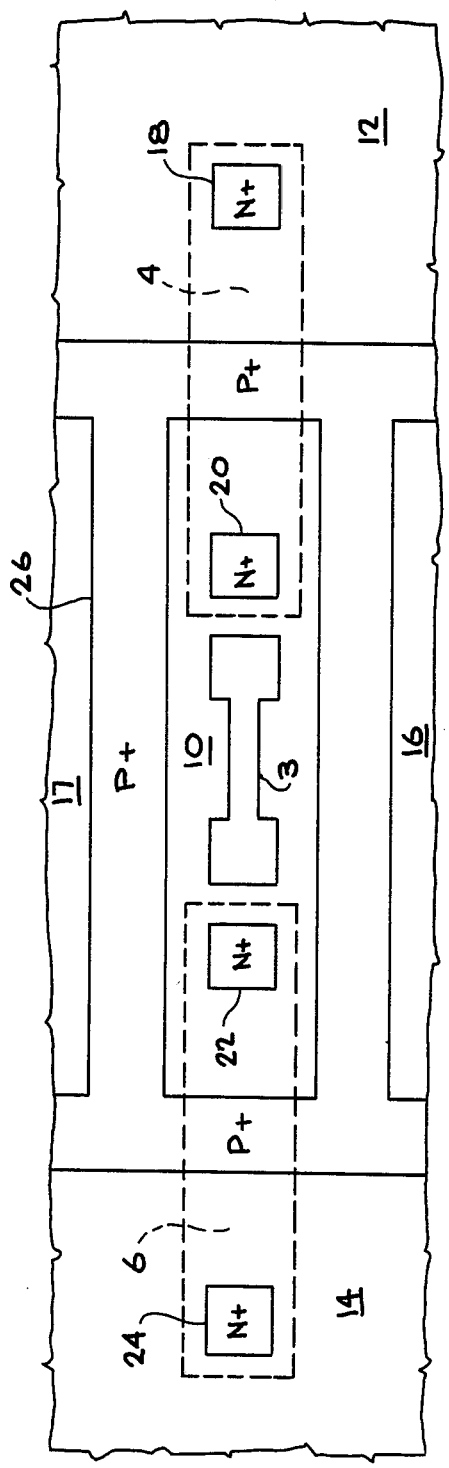
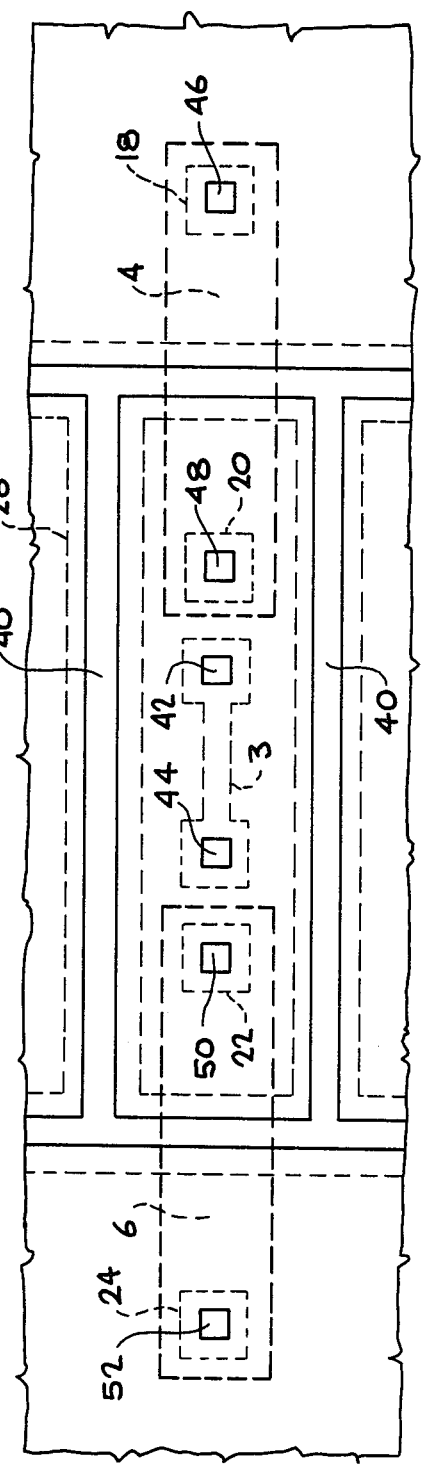

SEAL STRUCTURE FOR AN INTEGRATED CIRCUIT

BACKGROUND OF THE INVENTION

1. Field of the Invention

This invention generally relates to semiconductor integrated circuit device seal structures which prevent the migration of contaminants from one side of the seal structure to the other. More particularly, the present invention relates to a continuous seal structure having electrically isolated conductive lines which lie in an underlying stratum of the integrated circuit structure.

2. Description of the Related Art

One problem common to all semiconductor integrated circuits is contamination by undesirable ionic species. The ions of certain contaminants, such as sodium, are mobile in silicon dioxide ("oxide") and drift through the oxide toward regions with a negative bias. These contaminants can interfere with the normal operation of semiconductor devices by giving rise to changes in device characteristics, leading to failure of the integrated circuit. It is for this reason that integrated circuit devices require a topside, passivation layer if they are to be encapsulated in standard, low-cost, plastic packages.

Various semiconductor integrated circuit devices have been developed which are user programmable. Devices such as programmable logic array (PLA) circuits, programmable read only memory (PROM) circuits, and the like, are designed and manufactured with an architecture that a user can program, or customize, to fit the user's specific application by blowing appropriate fuses. In addition, many types of integrated circuits, such as static random access memories (SRAM) and dynamic random access memories (DRAM), use programmable fuses to activate redundant circuit elements which can replace defective circuit elements of the integrated circuit. Thus, the manufacturer can increase the number of good die on a wafer after fabrication. As shown in FIG. 1, MOCHIZUKI et al., U.S. Pat. No. 4,413,272, discloses a typical prior art semiconductor device having a fuse.

One method used to program a fuse-programmable device involves the use of a laser to blow the appropriate fuses. A typical laser-programmable device is disclosed by REDFERN et al., U.S. Pat. No. 4,238,839.

In accordance with prior art processes, the blowing of fuses must be carried out in a clean room before the final sealing step of the fabrication process to prevent contaminants from depositing on the wafer and ultimately making their way to adjacent circuitry.

A problem that arises with testing and laser programming of devices is one of efficiency of production. Each laser-test station can handle only a relatively small number of wafers within any given time. Furthermore, as device density increases, the wafer testing time during programming increases. Hence, an increased number of laser-test stations are needed in the clean room in order to keep production time to a minimum. Each laser-test station takes up a certain amount of clean room area. Therefore, if a large number of laser test stations is necessary to meet production demands, a considerable amount of clean room area must be dedicated to laser-test equipment in addition to the area necessary for housing fabrication equipment. Clearly, costs would be reduced and production efficiency increased if laser equipment could be housed outside expensive clean room areas. To enable laser equipment to be housed outside the clean room, however, the problem of contaminants must be solved.

Furthermore, for integrated circuits using laser-fuse-redundancy schemes, the wafers having the dice fabricated thereon must actually be tested twice. First, they are tested and the requisite customizing fuses are blown prior to the passivation step of the fabrication process. Then, the wafers must be retested to separate good die from bad die after the final sealing processing is completed. If the laser-test operation could be done after the final sealing process, this retesting could be eliminated, thereby reducing wafer cost. This would require a structure that would maintain passivation integrity for the integrated circuit through laser testing.

One form of seal structure is disclosed in U.S. patent application Ser. No. 637,460 (HASKELL et al.), assigned to the common assignee of the present invention. In that disclosed device, electrically isolated conductive lines pass from circuit components to the fuses through seal regions which surround the fuses. This allows rupturing of the device's passivation layer above the fuses, while preserving the passivation integrity for the remainder of the device, viz., outside of the sealed regions. The seal regions formed according to HASKELL et al. maintain passivation integrity for the integrated circuit and permit a final passivation processing step after, rather than before, the programming of fuses. Additionally, the fabrication process is difficult due to relatively severe step coverage requirements needed to properly form the physical structures disclosed. Leakage currents can arise between the conductive lines and the substrate. Therefore, the HASKELL et al. structure is not suitable for all integrated circuits.

Hence, there remains a need for an integrated circuit seal structure which overcomes the deficiencies and limitations of the prior art.

SUMMARY OF THE INVENTION

It is an object of the present invention to provide a semiconductor integrated circuit device having electrically isolated conductive lines which pass under seal regions to allow rupturing of the device's passivation layer on one side of a seal region, while preserving the passivation integrity on the other side of the seal region.

An advantage of the present invention is that laser testing which causes rupturing of the passivating layer can be done outside a clean room area.

Another advantage of the present invention is that circuit fuses can be blown with the passivation layer already in place, thereby eliminating the necessity of additional processing, which usually causes some yield loss, after the fuses are blown. Hence, the present invention helps maximize the yield of properly functioning dies per wafer.

A further advantage of the present invention is the elimination of the necessity of testing the completed integrated circuit twice. Rather than laser-testing before the final passivation layer processing and again afterwards, a single laser-testing operation can be performed after the final passivation layer is applied.

In a broad aspect, the present invention provides a seal structure for an integrated circuit fabricated on a semiconductor substrate. In the best mode embodiment described herein, the invention is described for an exemplary use of sealing fuse elements of an integrated circuit. As will be readily apparent to a person skilled in the art, other devices and even entire circuits can be enclosed by the continuous portions of the seal structure such that they are sealed, but still have conductive paths which extend into and out of the sealed region.

The seal structure comprises a continuous barrier comprising a hermetic material, such as aluminum, on an underlying heavily doped silicon region of the same conductivity type as the substrate. This continuous barrier encloses the fuse or other component(s) to be sealed off from the remainder of the integrated circuit. A conductive interconnect couples the fuse or other component(s) to a contact which also is located within the enclosing barrier. A second contact is located outside of the enclosing barrier and is coupled to a conductive interconnect leading to other circuit components outside of the enclosing barrier. The first and second contacts lead down to a region with conductivity type opposite that of the substrate. In CMOS integrated circuit fabrication, this region is typically formed by diffusing a well region between approximately 1.5 and 5.0 microns in depth. This region runs underneath the continuous barrier, thereby providing electrical connection between the fuse or other component(s) inside of the barrier and the circuit elements outside of the barrier. This entire structure, including all circuit elements both inside and outside of the barrier, is then covered by a hermetic passivating material, such as silicon nitride (which is impervious to moisture and ions which can penetrate silicon dioxide).

Thus, if a passivation layer sector above a fuse is ruptured, such as when a laser is used to blow the fuse, adjacent regions and components outside of the enclosed region are isolated from any contaminants introduced through said rupture.

Furthermore, in operation, the substrate and the enclosing barrier are held at a potential which is complementary to the potential applied to the well region or the conductive interconnect to the well region. This ensures that electrical isolation is maintained by a reverse-biased junction between the heavily doped silicon region of the continuous barrier and the underlying well region.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

FIG. 2 is a schematic plan view (top) diagram of the present invention showing an exemplary fuse element coupled to conductive lines.

FIG. 3a is a schematic diagram in cross-section taken in plane A—A of the present invention, as shown in FIG. 2, after a passivation layer has been formed.

FIGS. 4a through 4c show an idealized process sequence at various steps of completion of the present invention as shown in FIG. 2, and, more particularly:

FIG. 4a is a plan view (top) of a section on a semiconductor wafer surface having an exemplary fuse element, showing step completion after a doped surface barrier region, well regions, and well contacting regions have been formed;

FIG. 4b is a plan view (top) showing the structure of FIG. 4a after contact apertures to the well contacting regions and doped surface barrier region have been formed; and FIG. 4c is a plan view (top) showing FIG. 4 after the metal layer has been formed.

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable.

As an example of the best mode, the present invention will be described herein in a preferred embodiment as a seal structure for an integrated circuit which has fuse elements, such as a DRAM device. Clearly, this invention can be extended to uses other than for the sealing of circuits containing fuses. Therefore, the description in this context should not be considered as a limitation as other devices and even entire circuits can be enclosed by the continuous barrier such that they are sealed but still have conductive paths which lead into and out of the sealed region.

It should be recognized that many publications describe the details of common techniques used in the fabrication process of integrated circuit components. See, e.g., *Semiconductor & Integrated Circuit Fabrication Techniques,* Reston Publishing Co., Inc., copyright 1979 by the Fairchild Corporation. Those techniques can be generally employed in the fabrication of the structure of the present invention. Moreover, the individual steps of such a process can be performed using commercially available integrated circuit fabrication machines. As specifically helpful to an understanding of the present invention, approximate technical data are set forth based upon current 1.2 micron technology. Future developments in this art may call for appropriate adjustments as would be obvious to one skilled in the art.

Figure 1:
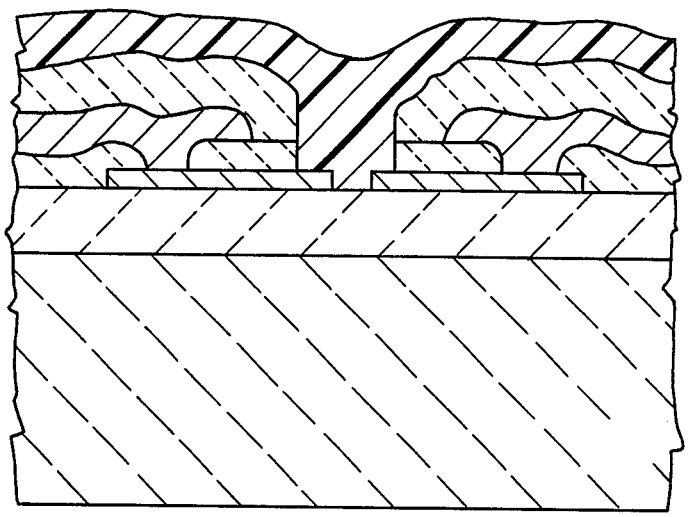
FIG. 1 is a cross-section of a conventional prior art semiconductor device having a fuse.
Figure 3B:
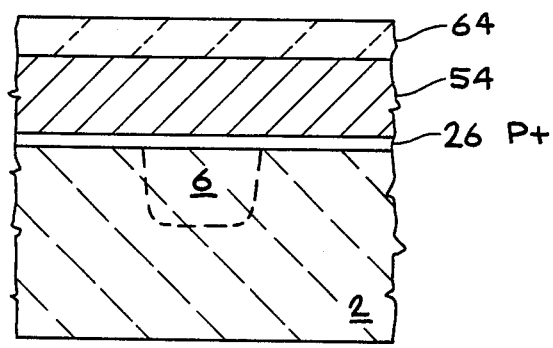
FIG. 3b is a schematic diagram in cross-section taken in plane B—B of the present invention, as shown in FIG. 2, after a passivation layer has been formed.

Referring to FIGS. 3 and 4a, the seal structure is formed on a crystalline silicon wafer substrate 2. The substrate 2 can be obtained pre-doped to have p-type or n-type conductivity. The present embodiment is described as starting with a p-type substrate. Note, however, this invention may be implemented on an n-type substrate by reversing the doping type for all regions described hereinafter and by reversing biasing potentials in operation.

Well regions 4, 6 are formed in the surface 8 of the substrate 2. Ions of n-type conductivity, as phosphorous, are introduced in a dosage such that the well regions 4, 6 have a surface dopant concentration of approximately $1 \times 10^{15}$ to $5 \times 10^{16}$. The depth of the well-to-substrate junction is in the range of approximately 2 to 5 microns.

Discrete regions of field oxide 10, 12, 14, 16, 17 are then formed. This can be accomplished by oxidizing the substrate and then masking and etching this oxide using standard photolithographic techniques or by using a conventional local oxidation process. Note, field oxide is not formed over areas 18, 20, 22, 24, 26 which will later be doped to form n+ or p+ regions.

It is at this stage that the fuses 3, such as of polysilicon or a metal silicide, are formed. A method for forming metal-silicide fuses is disclosed in U.S. Pat. No. 4,518,981 (Schlupp), assigned to the common assignee of the present invention. If polysilicon material is used for fuses, this step can be accomplished using the same polysilicon layer and masking steps used to define the gates of field effect transistors in the circuit.

The surface 8 is then masked with photoresist or silicon nitride using standard photolithographic techniques to open well contacting regions 18, 20, 22, 24 at each end of the well regions 4, 6. Ions of n-type conductivity are introduced in a dosage such that the regions 18, 20, 22, 24 have a surface concentration of approximately $2 \times 10^{19}$ to $2 \times 10^{20}$. These relatively heavily doped regions 18, 20, 22, 24 are therefore referred to as n+ regions.

A continuous, doped-silicon, barrier region 26 is formed in the surface 8. Ions of p-type conductivity, such as boron, are introduced in a dosage such that this barrier region 26 has a surface dopant concentration of approximately $2 \times 10^{19}$ to $2 \times 10^{20}$. This is a heavier doping than the substrate 2 and, therefore, is referred to as p+. This doping level is also much higher than the doping of the well regions 4, 6 and, therefore, converts the area of the surface of the well region redoped to a p-type semiconductor material. The depth of this p+ region 26 is typically between 0.25 and 0.50 microns.

The above steps result in a surface p+ region 26, which completely surrounds the fuse 3 region and two of the n+ regions 20, 22.

The well regions 4, 6 run underneath this p+ barrier region 26 and are used to form an electrically conductive path into and out of the enclosed fuse 3 region. During normal reverse-biased operation between the well regions 4, 6 and the substrate 2, the well regions 4, 6 are electrically isolated from each other, the substrate 2 and the p+ barrier region 26.

Referring to FIG. 4b, a silicon dioxide layer is formed, masked and etched to open contact apertures 46, 48, 50, 52 over the n+ regions 18, 20, 22, 24 and also to open a contact strip 40 over the p+ barrier region 26. The continuous contact strip 40 is formed within the outer boundaries of the p+ barrier region 26 which completely encloses the fuse 3 area. In this same step, the mask and etch technique can be used to open contact apertures 42, 44 down to the fuse 3.

Figure 4C:
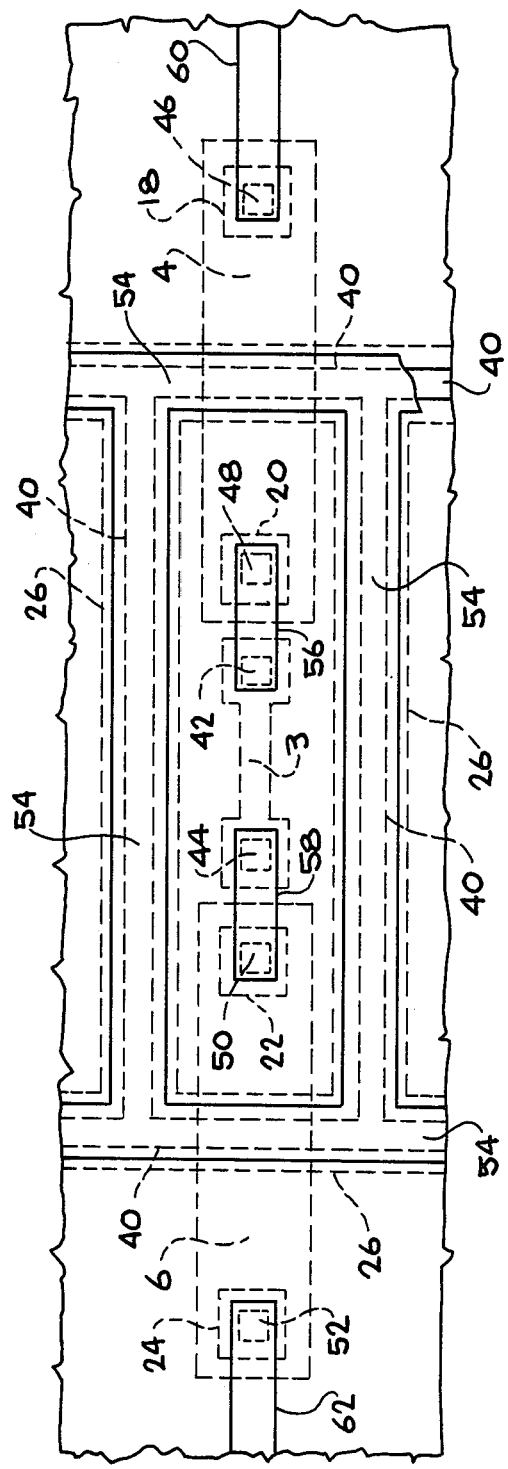

Referring now to FIG. 4c, metal interconnects, which in this example are formed of aluminum, are formed. Aluminum is deposited, masked and etched to leave the appropriate component interconnections for the circuit. With respect to the seal structure, a continuous metal strip 54 overlaps the contact strip 40 and makes contact down to the p+ barrier region 26. All contact apertures 42 through 52 are similarly covered by metal. Metal regions 56, 58 connect the fuse 3 to the n-well regions 4, 6 through contact apertures 42, 44, 48, 50 and n+ regions 20, 24. Discrete metal regions 60, 62 provide interconnects between the n-well regions 4, 6 through contact apertures 46, 52 and n+ regions 18, 24 and the appropriate components (not shown) of the integrated circuit outside of the enclosed region.

Referring back to FIG. 3a, it can be clearly seen that the n-wells 4, 6 provide coupling of the fuse 3 by running beneath the p+ barrier region 26 and superposing continuous metal strip 54.

In accordance with conventional techniques, a topside passivation layer 64 is then formed over the structure.

In operation, the n-wells 4, 6 (or the metal lines coupling to the n-wells) are always biased at a potential which is greater than the biasing potential of the substrate 2. The p+ barrier region 26 and the superposing continuous metal strip 54 are grounded to and, therefore, at the same potential as the substrate 2. This ensures that electrical isolation is maintained by means of a reverse-biased junction thus being formed between any of the conductors leading to the fuse and its adjacent components.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other technologies. Similarly, any process steps described might be interchangeable with other steps in order to achieve the same result. The embodiment was chosen and described in order to best explain the principles of the invention, and its practical application, to thereby enable others skilled in the art to understand the invention for various embodiments and with various modifications as are suited to the particular use contemplated. It is intended that the scope of the invention be defined by the claims appended hereto and their equivalents.

What is claimed is:

1. A seal structure for a semiconductor integrated circuit device having a plurality of circuit components in and upon a major surface thereof, said integrated circuit device is formed in a semiconductor material having a first conductivity type, comprising:

enclosing means at said major surface, for forming an enclosed region of said surface having at least one of said components within said enclosed region, said enclosing means including a material, which is impermeable to ions which are mobile in oxides of semiconductor materials, forming a continuous region in said major surface having said first conductivity type, wherein said enclosing means further comprises a continuous, metallic layer superposing said continuous region;

at least one conductive region within said surface which passes beneath said enclosing means such as to extend from outside said enclosed region to inside said enclosed region, said conductive region further comprising a well region having a conductivity of a second conductivity type; and a layer of material, comprising a material which is impermeable to ions which are mobile in oxides of semiconductor material, superposing and encapsulating at least said enclosing means and said enclosed region.

2. The seal structure as set forth in claim 1, wherein said conductive region and said enclosing means are coupled to biasing potential sources such that a reverse bias potential exists therebetween.

3. A seal structure for a semiconductor integrated circuit unit, having a substrate of a first conductivity type and a plurality of circuit component means, having electrical contact regions, constructed in and upon a major surface of said substrate, comprising:

enclosing means at said major surface, enclosing a region of said unit including at least one of said component means, for sealing said enclosed component means;

first contact means, having a second conductivity type, within said enclosed region, for coupling said enclosed component means to other said unit component means;

second contact means, having said second conductivity type, outside said enclosed region for coupling said enclosed component means to other said unit component means; and a well region, having said second conductivity type, in said substrate coupling said first contact means to said second contact means by passing beneath a section of said enclosing means.

4. The structure as set forth in claim 3, wherein said enclosing means and said well region are coupled to biasing sources such that a reverse-biased junction is formed between said well region and said section of said enclosing means.

5. The structure as set forth in claim 3, wherein said enclosing means further comprises:

a continuous doped region, having said first conductivity type, in said major surface; and a layer of conductive material superjacent said doped region.

6. The structure as set forth in claim 3, wherein said first contact means further comprises:

a seal structure first contact region, having said second conductivity type, in said major surface within said enclosed region; and a layer of conductive material adapted for coupling at least one of said enclosed component means contact regions to said seal structure first contact region.

7. The structure as set forth in claim 6, wherein said second contact means further comprises:

a seal structure second contact region, having said second conductivity type, in said major surface outside said enclosed region; and a layer of conductive material adapted for coupling said seal structure second contact region to at least one of said plurality of circuit component means outside said enclosed region.

8. The structure as set forth in claim 7, wherein said first and second contact means further comprise:

discrete insulator means in said major surface, for isolating said continuous doped region from said seal structure first contact region and said seal structure second contact region.

9. In a semiconductor integrated circuit structure, having a substrate of a first conductivity type, a plurality of circuit component means, having electrical contact regions, constructed within and upon a major surface of said substrate, and a layer of passivation material on said circuit structure, an improved seal structure for isolating said component means, characterized by:

first conductive means, superposing said major surface, for coupling one of said component means to said seal structure;

first seal contact means, having a second conductivity type, in said major surface and coupled to said first conductive means;

first seal contact means insulation means in said major surface adjacent said first seal contact means;

seal contact region, having said first conductivity type, in said major surface and enclosing said one of said component means, said first conductive means, said first seal contact means, and said first seal contact region insulator means;

second conductive means, superposing said major surface externally of said encircled means, for coupling said seal structure to a second of said component means;

second seal contact means, having said second conductivity type, in said major surface and coupled to said second conductive means;

second seal contact means isolation means in said major surface adjacent said second seal contact means and a portion of said seal contact region; and a well region, having said second conductivity type, subjacent said major surface and coupling said first seal contact means to said second seal contact means by passing beneath a section of said seal contact region.

10. The improved seal structure as set forth in claim 9, wherein said seal contact region and said subjacent well region are coupled to biasing potentials to form a reverse biased junction therebetween.

11. A seal structure for a fuse component on a semiconductor integrated circuit, having a substrate of a first conductivity type, comprising:

a first surface region, having said first conductivity type, surrounding said fuse;

a pair of first contact surface regions, having a second conductivity type, discretely coupled to opposite extremities of said fuse within said first surface region;

a pair of second contact regions, having said second conductivity type, external to said surrounded fuse; and a pair of well regions, having said second conductivity type, in said substrate discretely coupling a first and second contact region by extending beneath said first surface region from a first to a second contact surface region, whereby said surrounded fuse is sealed from the remainder of said integrated circuit and can be coupled thereto via said second contact regions.

12. The seal structure as set forth in claim 11, wherein said first surface region and said well region are biased such that a reverse biased junction is formed at the interfaces thereof.

13. The seal structure as set forth in claim 15, further comprising:

a metal layer superposing said first surface region.

* * * * *